's Patent [19]

United States Patent [19]
Geisel

[11] Patent Number: 4,507,605
[45] Date of Patent: Mar. 26, 1985

[54] METHOD AND APPARATUS FOR ELECTRICAL AND OPTICAL INSPECTION AND TESTING OF UNPOPULATED PRINTED CIRCUIT BOARDS AND OTHER LIKE ITEMS

[75] Inventor: Donald J. Geisel, Clifton Park, N.Y.

[73] Assignee: Testamatic, Incorporated, Latham, N.Y.

[21] Appl. No.: 379,005

[22] Filed: May 17, 1982

[51] Int. Cl.³ .............................................. G01R 31/12
[52] U.S. Cl. .................................. 324/73 PC; 324/52
[58] Field of Search ................. 324/51, 52, 54, 73 PC

[56] References Cited

U.S. PATENT DOCUMENTS 3,436,651  4/1969  Helms ..................................... 324/51
3,775,686 11/1973  Ganger ................................... 324/54

FOREIGN PATENT DOCUMENTS 3028353  2/1982  Fed. Rep. of Germany ........ 324/54

Primary Examiner—Stanley T. Krawczewicz
Assistant Examiner—Jose M. Solis
Attorney, Agent, or Firm—Charles W. Helzer

[57] ABSTRACT

This application describes a novel method and apparatus for the electrical and mechanical inspection and testing of unpopulated electronic printed circuit boards, ceramic substrates and other items which have conductive pathways formed thereon, interconnecting conductive pads and other conducting surfaces. Examination and testing is accomplished by placing a printed circuit board or other item to be tested within a sealed chamber which contains a gaseous atmosphere capable of cathode luminescence such as argon, neon and the like. The sealed chamber includes a transparent panel or partition which allows viewing of the printed circuit board or other item under test and preferably is electrically conductive. One terminal of a source of excitation electric potential is connected to the transparent conductive panel and the other terminal is applied to one of the metallic runs or paths on the surface of the sample item to be tested. The electric field produced between the metallic run or path on the sample item and the transparent panel or window in the sealed chamber causes the gas immediately adjacent to the run to emit light or other electromagnetic radiation in accordance with the well-known "cathode luminescence" phenomenon. The light or other emissions thus produced forms a pattern which matches in size and shape the conductive pathway or run on the sample item which has been electrically excited. The observed pattern is then compared to a known or desired pattern to determine whether it meets a preset standard.

33 Claims, 6 Drawing Figures

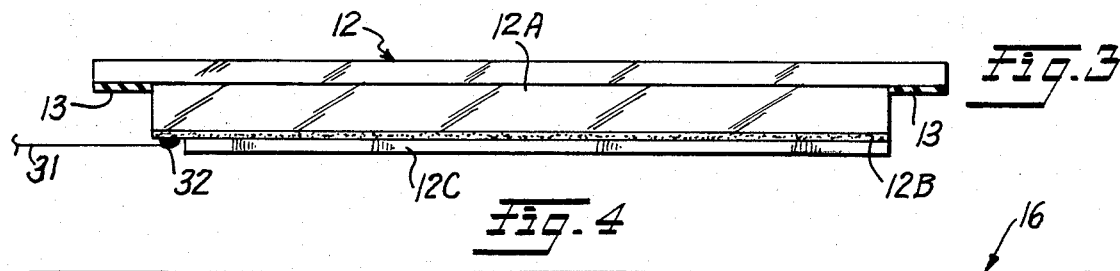
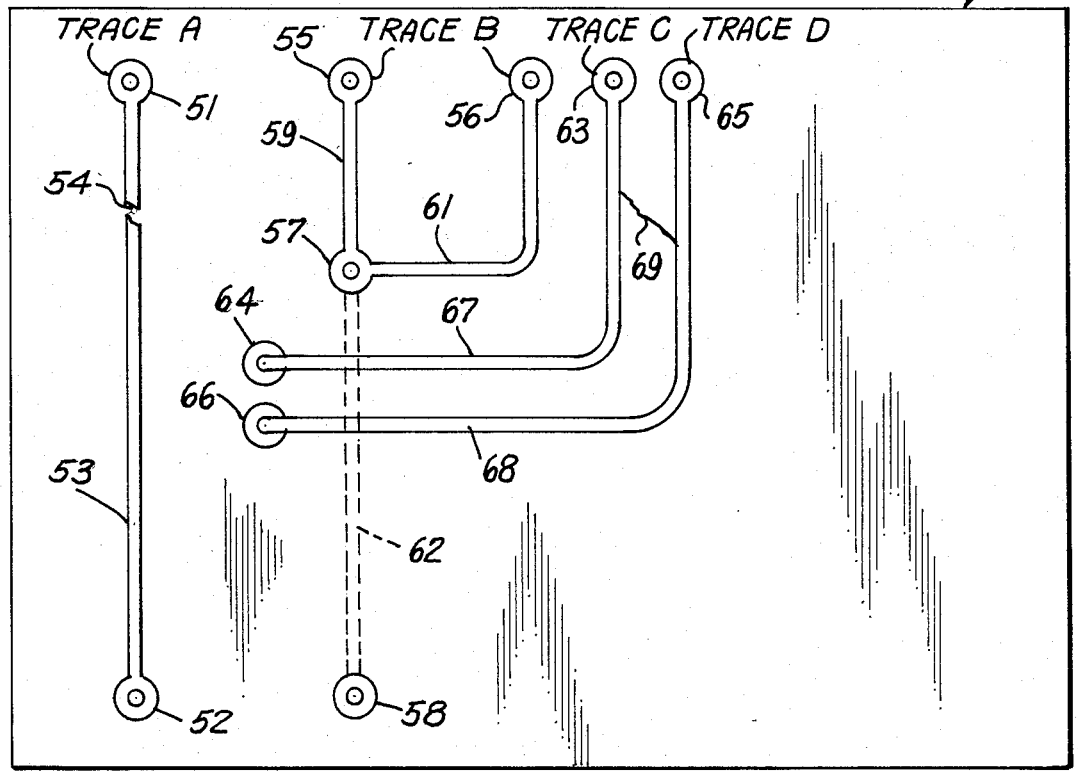
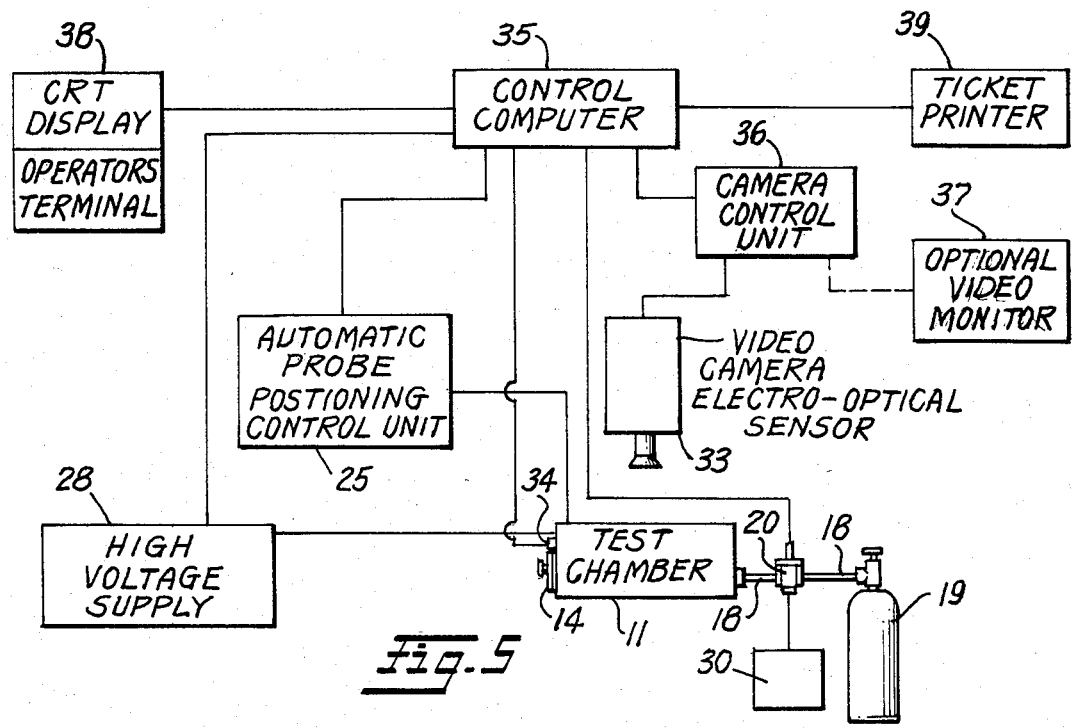

METHOD AND APPARATUS FOR ELECTRICAL AND OPTICAL INSPECTION AND TESTING OF UNPOPULATED PRINTED CIRCUIT BOARDS AND OTHER LIKE ITEMS

TECHNICAL FIELD

This invention is in the general field of inspection, test and measurement of the quality, shape and/or dimensions of conducting paths, pads, traces, or runs formed on the surface or on intermediate layers of a printed circuit board, ceramic substrate or other items which contain or include electrically conductive parts or surfaces.

More particularly, the invention makes available a new and improved method and apparatus for the automatic performance of the inspection, test, and measurement of electrical shorts and continuity required to be performed on unpopulated printed circuit boards, ceramic substrates, and other like items.

BACKGROUND PRIOR ART

The need for the present invention results from the inability of prior art devices to keep pace with recent developments in electronic circuitry and their methods of manufacture. Developments in solid state electronics and materials led to a quantum leap in the use of printed circuit boards (PC boards), ceramic substrates (substrates) and other similar items having conductive surfaces formed thereon and wherein it is necessary to establish continuity of the electrically conducting paths or traces together with the absence of undesired shorts. The PC boards or substrates, which typically are 1/32 of an inch to ⅛ of an inch thick, are composed of a phenolic plastic, glass epoxy, ceramic or other similar electrically insulating material, and range from postage stamp size up to several square feet. Bonded to the outer surfaces (and sometimes sandwiched between layers of insulation) are very thin coatings of copper, silver, gold or other metallic foils which act as conducting pathways, runs or traces. These paths are formed by patterns of very narrow lines of conducting material deposited or otherwise formed on the insulating layer of the PC board or substrate. At the end of each run is an enlarged area known as a pad which is used to connect either a component to the board or to make an external electrical connection to the board.

During the manufacture or subsequent handling of PC boards, substrates and the like, defects such as discontinuities (cracks) in a circuit pathway or run, or an unwanted continuity (short) between adjacent runs, may develop. Once components have been attached to the pads on printed circuit boards (usually by soldering) it is much more difficult and expensive to find and repair any such shorts and discontinuities which might exist. To deal with this problem, equipment was developed for automatically testing printed circuit boards and substrates for shorts and discontinuities before components were attached to the boards. This equipment works by applying to the various pads on a printed circuit board or ceramic substrate, voltages or other test signals, and then detecting these voltages or other signals at other specified pads on the board. With a voltage applied to a particular pad, all the other pads which should be connected via conducting pathways or traces to this first pad, should have a voltage present. Those which are not by design to have been electrically interconnected via pathways or traces, should not have a voltage present on them. By contacting many or all of the paths simultaneously, and using high speed electronic switching devices to connect and measure the respective testing voltages, testing of the boards could be accomplished relatively quickly.

The traditional device used to contact all of the pads of a printed circuit board or substrate simultaneously, is called a "bed of nails" fixture. As the name implies, this fixture consists of a frame with dozens or sometimes hundreds (maybe thousands) of small, nail-like contact points. Each contact has a wire extending from it to a machine which contains a test voltage source and measurement equipment via suitable interconnecting switches. To insure that each contact point makes good electrical contact to the proper pad, the contacts are usually gold plated, and the frames undergo precision manufacturing. Making such a "bed of nails" fixture is quite expensive and may take several weeks or months. As the number of contact points increases, the amount of pressure applied to the fixture and circuit board must also increase to assure good contact. This requirement itself may cause cracking of the boards or damage to the pad thus complicating the problem the equipment was originally designed to detect. Lastly, each type or size of circuit board to be tested requires its own particular "bed of nails" fixture.

Further increases in the complexity and decreases in the size of electronic circuit boards resulted in greater numbers of smaller sized traces or conductive pathways and pads being fitted onto a given area. These smaller, more fragile, traces and pads are more susceptible to shorts and discontinuities (cracks). Fixtures for automatically testing PC boards and substrates in this size range, required contact pins which are smaller (thinner) and more closely spaced. This has resulted in more expensive testing fixtures which are more delicate and thus more susceptible to damage from handling and use. This problem is particularly severe with respect to ceramic substrates and chip carrier assemblies presently being produced and used. On a ceramic substrate or chip carrier of this size range, there may be dozens or even hundreds of pads each of which can be as small as 20 mils (thousandths of an inch) and spaced apart by a comparable distance, namely 20 mils. The inability of the standard test fixtures to work with ceramic substrates or chip carriers resulted in the development of a specialized fixture called a probe card. The probe card uses very fine bent wires instead of pins to contact the pads on a substrate or chip carrier being tested. The probe card fits around the substrate or chip carrier in such a manner that the fine wires make contact with the substrate or chip carrier pads. Like the larger "bed of nails" fixtures, the probe cards just be precision manufactured, are expensive, are susceptible to handling damage, must be specifically designed for a particular type of ceramic substrate or chip carrier and require a very substantial lead time on the order of serveral weeks or even months to manufacture.

SUMMARY OF INVENTION

The present invention provides a novel method and apparatus for performing electrical continuity and physical measurement tests on printed circuit boards, ceramic substrates and other items which have electrically conductive paths, pads or surfaces formed thereon. The invention eliminates the expense and other problems associated with the use of conventional "bed of nails" fixtures and probe cards.

In practicing the invention, a printed circuit board, ceramic substrate, or other item to be tested is placed into a sealed chamber through a suitable sealable door or window. The sealable chamber has a transparent conductive window or partition through which an operator or video camera or the like can view the item being tested. After placement of the item to be tested within the sealable chamber, the chamber is first evacuated and then a gaseous atmosphere formed of neon, argon or the like is introduced into the sealed chamber and a voltage is applied by a small mass, movable probe to a particular pathway, pad or trace on the test piece. A voltage also is applied to the transparent conductive window so that an ionizing potential field is produced within the chamber and causes the gas immediately adjacent the electrically energized traces or conductive pathways and pads to emit light or other electromagnetic radiation in accordance with the well-known "cathode luminescence" phenomemon. The light or radiation thus emitted may be viewed by an observer or by a video camera or other sensing unit which derives an output electrical signal representative of the light or radiation pattern. This output electrical signal may then be sent to a mini-computer or other logic circuitry for comparison to a known, expected pattern to determine if the test piece meets a predetermined standard. Discontinuities or shorts become immediately apparent by the present or absence of a light image at the points in question. The strings (groups of conductive pathways, traces or pads, which are electrically interconnected to each other) are contacted one at a time by the movable probe which may be moved to any desired point within an x-y plane on the surface of the test piece. In addition to electrical continuity or discontinuity, the mechanical size and shape of each pathway, pad, trace, etc. may be visually observed by an operator or by a video camera and measured. Thus, testing for both electrical continuity and undesired shorts as well as visual inspection of the physical size of the various strings, runs and pads can be conducted simultaneously.

BRIEF DESCRIPTION OF THE DRAWINGS

These and other objects, features and many of the attendant advantages of this invention will be appreciated more readily as the same becomes better understood from a reading of the following detailed description, when considered in conjunction with the accompanying drawings, wherein like parts in each of the several figures are identified by the same reference character, and wherein:

FIG. 3 is a detailed, side sectional view showing the construction of a transparent, conductive window employed as a partition in the sealable test chamber shown in FIG. 1;

FIG. 4 illustrates a typical printed circuit board having several conductive pathways or traces interconnecting pads on the surface of the PC board, some of which are defective; and FIG. 5 is a functional block diagram of a typical test system for carrying out the novel testing method made available by this invention and which employs the test apparatus illustrated in FIG. 1.

BEST MODE OF PRACTICING THE INVENTION

Figure 1:
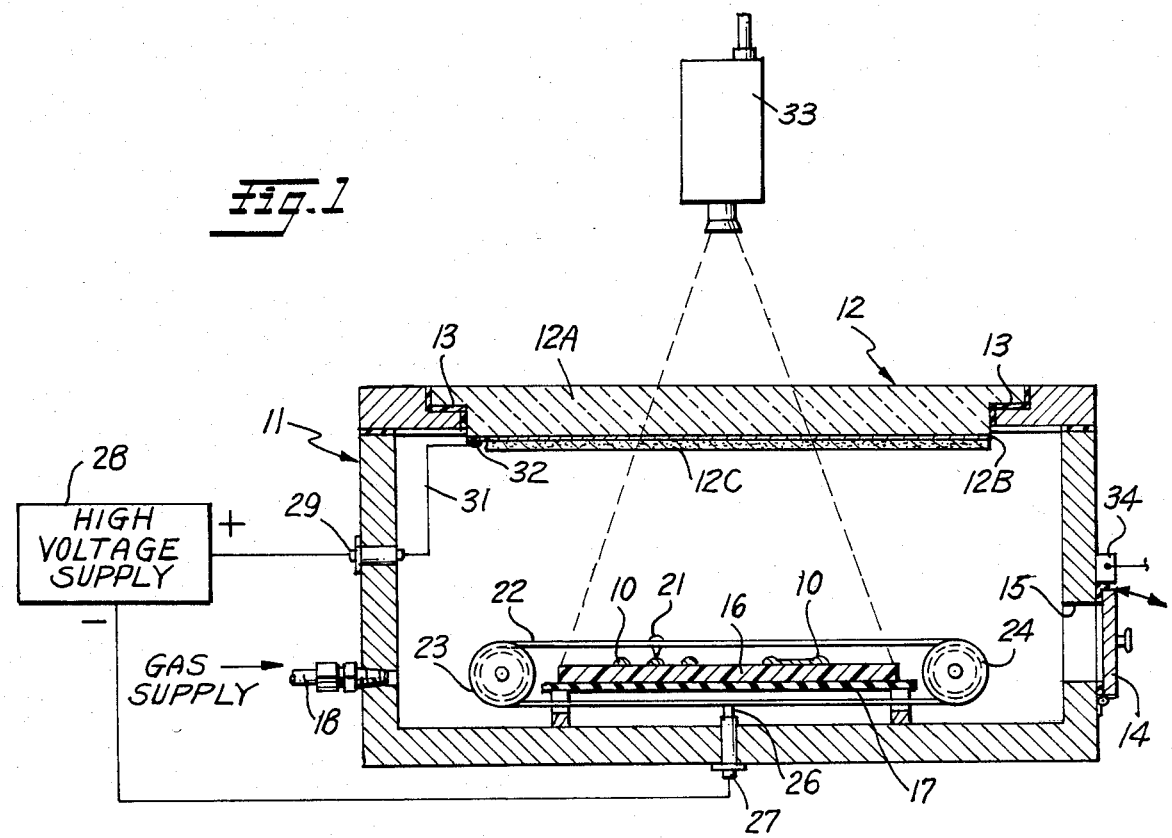
FIG. 1 is a side sectional view of a novel test apparatus employing a sealable chamber in which a PC board under test is mounted, and illustrates the method for testing such items according to the invention.

As illustrated in FIG. 1 of the drawings, the improved testing and inspection appatatus for printed circuit boards and the like is comprised by a sealable chamber 11 constructed of a light-weight, sturdy material such as aluminum or plastic and of a size proportioned to accept a given range of sizes of printed circuit boards to be tested. The sealable chamber 11 includes a transparent, conductive partition or window 12 that is secured over a substantial sized opening in the top of the chamber 11 and sealed to chamber 11 by means of the gaskets shown at 13. Access to the interior of the sealable chamber 11 is provided by a movable door 14 having gaskets for sealing it closed over an opening 15 for providing easy access to the interior of chamber 11. Test specimens in the form of a printed circuit board, ceramic substrate, or other like items shown at 16 are inserted in place within chamber 11 through the door 14 and opening 15 and positioned on a suitable insulated stand indicated at 17 below the view provided by the transparent partition 12. It is understood that the transparent partition 12 as well as the test specimen 16 are substantially rectangular in area and the viewer is only seeing a cross sectional view of each of these items in FIG. 1. Because of this, only cross sectional portions of the respective conductive pathways, runs, pads and the like formed on the surface of the printed circuit board 16 to be tested, are seen at 10.

The interior of sealable chamber 11 is supplied through a gas supply tube 18 with a suitable gaseous atmosphere capable of cathode luminescence as will be described hereinafter with relation to FIGS. 2 and 2A. The gaseous atmosphere may be any gas, vapor, or combinations thereof at a pressure on the order of 10-100 millimeters absolute. The inert elements, namely, helium, neon, argon or mixtures thereof and the like are particularly well suited for this application. To accomplish this the test chamber 11 is connected by the tube 18 and appropriate electrically operated valving 20 to a supply tank 19 and to a vacuum pump 30 as shown in FIG. 5. The valve 20 is activated so that following each insertion of a test specimen 16 into the chamber, the chamber is first evacuated by the pump and then filled with gas from the tank.

A high speed, low mass, movable probe shown at 21 in FIG. 1 is supported on a fine insulated wire 22 of electrically conductive material by means of a set of pulley wheels 23 and 24 which are fabricated from an electrically insulating material. The pulley wheels 23 and 24, fine wire 22 and small mass probe 21 all comprise a part of a high speed, low inertia, low mass automatically operable probe positioning mechanism which is described in greater detail in co-pending U.S. application Ser. No. 379,004, filed May 17,1982 concurrently with this application and entitled "High Speed, Low Mass, Movable Probe and Instrument Positioner For Use In Controlled Environment Chamber" —David P. Rogers and Donald J. Geisel, inventors. For a more detailed description of the construction and operation of the automatic probe positioning mechanism 21, 22, 23, 24, etc. reference is made to the co-pending U.S. application Ser. No. 379,004, the disclosure of which is hereby incorporated into the disclosure of this application in its entirety. Briefly, however, it can be stated that the automatic probe positioning mechanism through the pulley wheels 23, 24 can cause the probe 21 which is secured to fine wire 22 to be moved right or left to any desired position along one axis of the substantially x-y planar surface of the printed circuit board 16 or other like item under test. If the longitudinal dimension of the test printed circuit board 16 shown in FIG. 1 is defined as the x axis, then the complementary y axis of the surface of the board would extend into and out of the plane of the paper of the drawing as viewed by the reader. The y axis movement mechanism has not been shown but is described more fully in the above-noted pending U.S. application Ser. No. 379,004. The y axis movement mechanism will cause the probe 21 including the fine wire 22 and its supporting pulley wheels 23 and 24 to be moved along the y axis into and out of the plane of the paper as viewed by the reader in accordance with input commands received from an automatic probe positioning control mechanism 25 shown in Block diagram form in FIG. 5 of the drawings. This same probe positioning control system also causes the pulley wheels 23 and 24 to position the probe 21 over a desired test point 10 as will be described hereafter with relation to FIG. 4 of the drawings.

The high speed, low mass movable probe 21 is electrically connected through the fine wire 22 and a suitable electrical connector shown at 26 in FIG. 1 to the negative terminal 27 of a high voltage supply source 28 having a voltage of about 400 to 900 volts. The positive terminal 29 of the high voltage supply source 28 is connected by means of a conductor 31 that is bonded at 32 to a highly conductive, transparent layer 12B that comprises part of the transparent partition or window 12. The construction of the transparent, electrically conductive partition or window 12 is best seen in FIG. 3 of the drawings. With reference to FIG. 3, the transparent window 12 is comprised by an upper outer layer 12A of glass which has a circumferential rim portion on the underside of which the gasket material 13 is bonded or otherwise secured. The transparent window assembly is held in place over the opening in the top of the sealable chamber 11 by means of a complementary seat or rim portion on which the gasket 13 and rim portion of glass layer 12A is seated. The outer, insulating glass layer 12A may have a thickness on the order of $\frac{1}{4}$ of an inch so as to provide sufficient rigidity to the structure and not be easily fractured. The under or inside surface of glass layer 12A is coated with a very thin layer (approximately 2000 Angstrom units) of tin oxide, or a gold metallization layer of approximately the same thickness, or some other suitable conductive material to form a highly conductive, transparent, intermediate layer 12B. The wire 31 is bonded at 32 to the tin oxide intermediate layer 12B by carbon impregnated paint or other similar conductive bonding material. Disposed under the intermediate layer 12B is a third layer 12C which may comprise a high electrical resistance, water impregnated, polymer coating which is approximately 0.2 mils thick. The high conductivity layer 12B is designed to have a resistivity of about 100 ohms per square and the low conductivity layer has a conductivity of between $10^4$ and $10^8$ ohm centimeters. The purpose of the high electrical resistance, water impregnated polymer coating layer 12C will become more apparent hereafter following a reading of the description relating to FIG. 2 of the drawings.

While it is possible to employ the novel test method and apparatus illustrated in FIG. 1 and described hereafter manually by an operator physically observing the surface of a test printed circuit board or other item through the transparent window 12, such manual use of the apparatus is not preferred. It is possible to fully automate the testing method by employing an electro-optical sensing unit in the form of a viedo camera 33 which is positioned to view the entire surface area of the printed circuit board 16 under test through the transparent, electrically conductive window 12. The video camera 33 may be of conventional construction and provides an x-y scan over the entire field of view of the x-y plane of the test printed circuit board 16 at a video Scan rate which is several orders of magnitude faster than the speed at which the test probe 21 can be moved from one test point to another by the probe positioning mechanism 22, 23, 24, etc. Here again it should be noted that the probe 21 itself is of a very small mass and secured to a very fine conductive wire 22. These are the only elements of the probe positioning mechanism which are disposed between the top surface of the printed circuit board under test and the view of the video camera 33. Hence, there is substantially no obscuration of the view of the top surface of the test printed circuit board 16 by the probe 21 and its positioning mechanism, which would interfere with the testing of the board as described hereafter.

Figure 2:
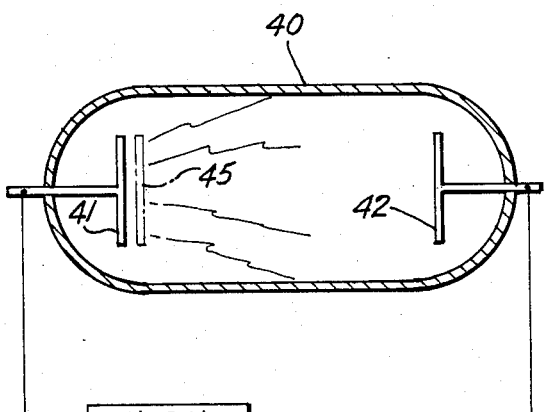
FIG. 2. is a simplified drawing illustrating the principal of "cathode luminescence" emission that occurs in an electrically excited pad and which principle is employed in practicing the invention.
Figure 2A:
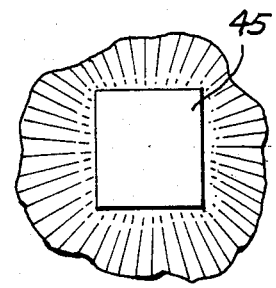
FIG. 2A is a partial, fragmentary view of the "cathodeluminescence" image produced by the simplified test setup shown in FIG. 2 while operating.

The principle of "cathode luminescence" which is exemplified by electromagnetic emission from an excited gas which may or may not be in the visible portion of the spectrum, will be better understood by referring to FIGS. 2 and 2A of the drawings. A sealed container or chamber 40 is provided which contains two metal electrodes 41 and 42 and is filled with a suitable gaseous mixture such as one of the inert gases listed in the Periodic Table such as neon or argon. The electrodes 41 and 42 are connected through a current limiting resistor 43 to a high voltage supply source 44 with the electrode 41 being connected to the negative terminal of the high voltage supply and the electrode 42 being connected through limiting resistor 43 to the positive terminal of the high voltage supply. Electrode 41 which is connected to the negative terminal of the high voltage supply source 44 is referred to as the cathode and the electrode 42 connected to the positive terminal is referred to as the anode. For simplicity in this example, assume that the high voltage supply source 44 is a direct current (DC) voltage. By placing this high voltage on electrodes 41 and 42 an electric field is created in the space between the two electrodes. This electric field causes the electrons in the atoms of the gas(neon, argon etc.) to move in a certain manner and this movement results in the release or emission of energy in the form of light or other electromagnetic radiation from the gas. This property is called cathode luminescence, electroluminescence or negative glow, and has been known in physics circles for many years. It is the basis for numerous gas discharge displays such as neon lights. The illuminated area shown at 45 in both FIG. 2 and FIG. 2A is only that area immediately adjacent to the cathode 41. FIG. 2A is the illuminated image of the area of cathode 41 as would be seen by an observer looking at cathode 41 from the right hand end of container 40.

Any conductor within the container 40 which is connected to the negative terminal supply also will act as a cathode and have a glow (cathode luminescence) associated with it. The conductor must be in direct electrical contact with the electrical supply as even a small gap or break in the electrical connection will prevent the production of the cathode glow.

With reference now to FIGS. 1 and 3 of the drawings, it will be seen that the high resistance, water impregnated coating layer 12C is interposed between the gaseous atmosphere contained within the sealable chamber 11 and the intermediate, highly conductive, transparent layer 12B. Thus it will be appreciated that the high resistance layer 12C functions as a series limiting resistor in the test apparatus of the invention in much the same manner as the limiting resistor 43 functions in the simplified diagram of FIG. 2.

When it is desired to use the apparatus of FIG. 1 in conducting a test of a printed circuit board 16, the printed circuit board 16 is placed on the supporting platform 17 which is secured to the bottom of the chamber 11 so that the test printed circuit board rests on the electrically insulated support platform 17 immediately below transparent window 12. The loading door 14 then is closed. Closure of door 14 is sensed by a micro switch 34 or other suitable sensor shown in FIG. 1 adjacent to door 14 and this fact is signalled to control computer 35 shown in FIG. 5. Control computer 35 then sends a signal to an electrically operated valve 20, opening the valve for a sufficient period to first evacuate the sealable chamber 11 and then charge it with the gaseous mixture from tank 19 and thereafter immediately closes. Control computer 35 then signals the automatic probe positioning control unit 25 to cause the automatic probe positioning mechanism to position probe 21 at a desired test pad or point on the test printed circuit board 16. Upon reaching the desired or preset test point, this fact is signalled to control computer 35 which then actuates the high voltage supply 28 to apply a high voltage excitation potential across the test chamber between the test pad or run being excited by probe 21 and the transparent conductive window 12. It will be noted that the test pad or circuit pathway on board 16 is connected to the negative terminal of high voltage supply 28 so that it in fact acts as a cathode when the high voltage supply 28 is turned on. Upon this occurrance, the gaseous mixture becomes excited and emits visible light or other radiation from the area immediately adjacent to the energized traces or pads on circuit board 16. The cathode emissions may be viewed through the transparent plate by the video camera 33. The images or patterns viewed by the camera are then converted into electric signals representative of the characteristics of the pattern being viewed and are supplied through a camera control unit 36 back to control computer 35. If desired, an optional video monitor 37 may be coupled to the camera control unit so as to provide a display of what is viewed by the video camera 33. In addition, the control computer 35 provides a cathode ray tube (CRT) display 38 listing all the pads, traces, runs, etc. which were either shorted, open (discontinuous), or otherwise did not meet the known or expected pattern criteria. The CRT 38 is located, at the operator's terminal and can be viewed by an operator for readily determining whether or not any discontinuity or undesired short is present in the circuit board under test. Lastly, the control computer 35 provides a hard copy printed readout on a ticket printer 39 in order to provide a permanent record of the results of the test being conducted.

FIG. 4 of the drawings shows a top view of an exemplary printed circuit board with four runs or traces, trace A, trace B, trace C and trace D, which are designed to be electrically isolated one from the other. Trace A has two pads 51 and 52 connected by a single run 53, which has a crack 54. Trace B is a string made up of four pads 55, 56, 57 and 58 connected by three runs 59, 61 and 62. Note that the run 62 between pads 57 and 58 is not on the top surface of the printed circuit board but is contained between layers or may run on the opposite side (bottom) of the board. Traces C and D each have two pads 63, 64 and 65, 66 connected by runs 67 and 68, respectively. Note, however, that a very fine whisker short 69 exists between the traces C and D.

If the printed circuit board shown in FIG. 4 is placed in the test chamber 11 of FIG. 1, and the movable probe 21 is moved to contact pad 51, an observer would see that the gas above pad 51 and that portion of run 53 before the crack 54 would glow. However, pad 52 and the rest of the run 53 would remain dark indicating that a discontinuity in the form of a crack 54 exists in run 53. If movable probe 21 is then moved to contact pad 55 on trace B, the observer would see the gas above pads 55, 56, 57 and 58 and runs 59 and 61 glowing. Even though the trace or run 62 is hidden between or under the layers of the insulating substrate for the printed circuit board, the observer would know that it is a good run (electrically continuous) because he would see a glow about the pad 58. If the movable probe 21 is then moved to contact pad 63, because of the whisker short 69, he would observe a glow above all of pads 63, 64, 65 and 66 as well as traces or runs 67 and 68. This extra glowing area of pads 65, 66 and run 68 indicates that an improper or unwanted connection in the form of the whisker short 69, exists on the board. By comparing the glow pattern of a given printed circuit board to the pattern of a known good board, the observer can quickly determine the condition of the board under test. This comparison may be done visually or by converting the patterns into digital data and analyzing data in the control computer as shown in FIG. 5. Note that it is not necessary to examine the entire glow pattern to determine shorts and continuities as well as discontinuities, but that it may be necessary only to examine certain selected points. It should also be noted that the size and shape of the pads, traces or runs (or any conducting surface on the board) can be physically measured and analyzed using this arrangement thereby providing simultaneously a physical check of the actual size of the pads, runs and traces as well as a check of the electrical continuity and/or discontinuity.

An example of the design parameters of a test apparatus constructed according to the invention for use in testing printed circuit boards and ceramic substrates with a maximum size of 5 inches by 5 inches in area, would be as follows. The maximum number of points to be tested would be 1,024 providing for a minimum pad size of 20 mils with a minimum pad spacing center to center of about 20 mils. Typical test speed for the automatically movable probe would be 100 points in 1.4 seconds 500 points in 7 seconds and all 1024 points in 14 seconds. These times are approximate based upon 4 points per continuity string or trace. The load and unload time for a typical operator would be approximately 30 seconds. It is anticipated that the control computer 35 would contain a 64 K byte main memory and employ a user software package utilizing dual mini floppy disk drives each with 780 K bytes storage. It is expected that eight to twelve user programs could be stored on each floppy disk.

From the foregoing description, it will be appreciated that the invention provides a unique non-multiple contact method and apparatus for testing, for shorts and discontinuities in printed circuit boards, ceramic substrates and other like items. The term "non-multiple contact testing" is intended to refer to a means for performing shorts and continuity testing by eliminating the conventional "bed of nails" fixture which currently is the industry approach for contacting printed circuit boards or ceramic substrates during test. The new non-multiple contact testing approach made possible by the invention completely eliminates the need for the costly "bed of nails" fixtures in addition to providing a visual method to actually see and pinpoint the existence and location of failures in a printed circuit board under test. The method and apparatus can be run in small job shop operations using manual observation by an operator or alternatively may be fully automated employing computer control to achieve high speed testing of printed circuit boards and ceramic substrates.

As a consequence of the above-listed characteristics, the novel testing method and apparatus made available by the invention provides the following advantages. Since a "bed of nails" fixture is no longer required, the total cost of testing printed circuit boards, ceramic substrates and like items, is reduced substantially. While the initial cost of the basic equipment is about equivalent, there are no recurring fixturing costs which arise each time a new printed circuit board design has to be tested. The non-multiple contact testing achieved with the present invention does not require new and costly fixtures for each different product requiring test. The new testing approach made available by the invention has a capability of testing much higher density products than can presently be accomplished using conventional "bed of nails" fixtures. The non-multiple contact testing has several times the probing accuracy of conventional fixtures. Boards and substrates for chip carriers can easily be tested with this new approach. The only lead time required to get a quantity of printed circuit boards flowing through a given test station is the one or two days of computer programming required to control automatic placement of the movable probe 21. This time is equivalent to that required to program equipment using a "bed of nails" fixture; however, the long lead time required to order and obtain a specially designed "bed of nails" fixture and its expense, are eliminated. Since the cost and lead time are significantly reduced, the testing of low volume and engineering prototype boards and substrates in job shop type operations becomes economically attractive. In the past, any circuit builder who wished to perform shorts and continuity testing of its circuit boards and ceramic substrates had to have sufficient volume to justify the initial cost and problems associated with installing and fixturing the test equipment. As a result, many circuit boards and substrates went untested because of this requirement. With the present invention, economic testing of such circuit boards and ceramic substrates becomes feasible.

While in the preferred configuration of the invention conductive and resistive layers within a transparent partition or window are used in developing a high voltage field across the gaseous mixture, the invention is not restricted to practice in this manner. For example, in place of the transparent conductive window 12 it is possible to employ a conventional transparent glass plate which has attached to its underside or around its circumference one or a plurality of very thin, closely-spaced conductors with each conductor having an individual current limiting resistance connected in series with it. The conductors can be many, small diameter, closely spaced-apart parallel wires or may be arrayed in a grid so that intersecting conductors do not contact each other but are electrically isolated one from the other. Other alternative arrangements similar to those described could be employed as will be obvious to those skilled in the art in light of the above teachings.

INDUSTRIAL APPLICABILITY

This invention relates to the automatic testing with a non-multiple contact apparatus for the existence of shorts and continuity of traces and runs on unpopulated circuit boards and ceramic substrates used in electronic equipment and provides for simultaneous electrical testing and mechanical inspection of such boards.

Having described one preferred embodiment of a new and improved method and apparatus for electrical and mechanical inspection and testing of printed circuit boards and other like items in accordance with the invention, it is believed obvious that changes, additions and variations may be made in the particular embodiment of the invention described which are within the full intended scope of the invention as defined by the appended claims.

What is claimed is:

1. An apparatus using the electrical and photo-emissive properties of a gaseous atmosphere for the electrical and physical inspection and testing by optical means of ites such as printed circuit boards, ceramic substrates, and other like items which contain or include electrically conductive parts, paths, and surfaces whose electrical and physical continuity and conformance to a standard is to be verified, said apparatus comprising a sealable substantially airtight chamber for containing a gaeous atmosphere while allowing access to the interior thereof for the placement of items under test, means for introducing a gaseous atmosphere capable of cathode luminescence at a low pressure into the sealable chamber with an item to be tested in place within the chamber, a movable probe disposed within the sealable chamber for coupling one terminal of a source of excitation electric potential to desired test points located within an x-y plane on the surface of an item under test, said sealable chamber having a transparent partition disposed over the location of an item under test for allowing viewing of the surface of an item being tested, and means for coupling a remaining terminal of said source of excitation electric potential to a conductive surface in said sealable chamber substantially opposite the surface of an item under test whereby cathode luminescence is produced within the sealable chamber around test points excited by said movable probe and around all points having electrical continuity therewith.

2. An apparatus according to claim 1 wherein the gaseous atmosphere introduced into the sealable chamber is at a pressure on the order of 10-100 millimeters absolute, and more particularly comprises one of the inert elements namely helium, neon, argon and mixtures thereof and the apparatus further includes means for evacuating the interior of the chamber to a low pressure in the range of 10 to 100 millimeters absolute pressure prior to the introduction of the gaseous atmosphere therein.

3. An apparatus according to claim 1 wherein the sealable chamber is designed to operate at low pressure and includes a sealable and easily opened and closed door through which items under test may be inserted and removed readily from the interior of the sealable chamber withint impairment of its sealable character and the low pressure gaseous atmosphere contained therein.

4. An apparatus according to claim 1 wherein the transparent partition comprises a window, door and other like partition of the sealable chamber positioned to allow viewing the surface of an item under test and the movable probe has a very small mass so as not to obscure the view of an item under test while being viewed through the transparent partition.

5. An apparatus according to claim 1 wherein the transparent partition in cross section comprises three layers including a transparent insulating cover layer, a transpartent, low resistance, high conductivity intermediate layer, and a low conctivity, high resistivity inner layer that is exposed to the gaseous atmosphere in the in the interior of the sealed chamber.

6. An apparatus according to claim 1 wherein the transparent portion comprises a conventional inulating transparent plate which has supported on its underside exposed to the gaseous atmosphere a plurality of very thin, closely spaced conductive ires with each conductive wire having an individual current limiting resistance connected in series circuit relationship with it.

7. An apparatus according to claim 5 wherein the outer insulating cover layer comprises a glass plate about ¼ of an inch thick, the inermediate low resistance, high conductivity transparent layer comprises a tin oxide, or a gold metallization layer, or other similar material having a thickness of approximately 2000 Angstrom units and the low conductivity, high resistivity inner layer is comprised of a high resistance, water inpregnated polymer coating of about 0.2 mils thick.

8. An apparatus according to claim 1 wherein the movable probe has an extremely low mass in the form of a conductive tip formed on a fine wire and is movable at a high velocity over the x-y plane of a rinted circuit board, ceramic substrate, or other similar item under test within the sealable chamber and dos not substantially impair the view of the item under test through the transparent partition.

9. An apparatus according to claim 1 further including an electro-optical sensing unit for observing the surface of an item under test through the transparent partition and for producing an output display for ready viewing by an operator of the apparatus.

10. An apparatus according to claim 1 wherein the movable probe has an extremely small mass in the form of a dot of conductive material secured to a fine wire and moves at high velocity over the x-y plane of a printed circuit board, ceramic substrate or other similar item under test, and the apparatus further includes an electro-optical sensing unit for examining the surface of the item under test through the transparent partition and for producing a display that may be readily viewed by an operator of the apparatus.

11. An apparatus according to either claim 9 or 10 further including a control computer for automatically controlling the positioning in the x-y plane of the movable probe in accordance with a predetermined program and wherein said electrooptical sensing unit provides an electronic readout signal for supply back to the control computer for comparison to a known standard.

12. An apparatus according to either of claims 1, 2 or 3 further including a gas supply for reestablishing the gaseous atmosphere within the sealable chamber after each opening of the chamber and removal and insertion of a new test item therein, and automatically operable valving means for disconnecting the supply of gaseous atmopshere upon opening of the sealable chamber and automatically valving in a new supply in the correct quantity and pressure of gaseous atmosphere after insertion of the new test item and closure of the sealable chamber.

13. An apparatus according to claim 2 wherein the sealable chamber is substantially airtight and includes a sealable and easily opened and closed door through which items under test may be inserted and removed readily from the interior of the sealable chamber without impairing its substantial airtight character.

14. An apparatus according to claim 13 wherein a transparent partition comprises a window, door and other like partition of the sealable chamber positioned to allow viewing the surface of an item under test and the movable probe has very small mass so as not to obscure the view of an item under test while being viewed through the transparent partition.

15. An apparatus according to claim 14 wherein the transparent partition in cross section comprises a conventional transparent insulating plate which has attached to its underside exposed to the gaseous atmosphere a plurality of very thin, closely spaced electrical conductors with each conductor having an individual current limiting resistance connected in series with it.

16. An apparatus according to claim 15 where in the movable probe has an extremely low mass in the form of a conductive tip formed on a fine wire which is movable at a high velocity over the x-y plane of a printed circuit board, ceramic substrate, or other similar item under test within the sealable chamber and which does not substantially impair the view of the item under test through the transparent partition.

17. An apparatus according to claim 16 further including an electro-optical sensing unit for observing surface of an item under test through the transparent partition and for producing an output display for ready viewing by an operator of the apparatus.

18. An apparatus according to claim 17 further including a control computer for automatically controlling the positioning in the x-y plane of the movable probe in accordance with a predetermined program and wherein said electrooptical sensing unit provides an electronic readout signal for supply back to the control computer for comparison to a known standard.

19. An apparatus according to either of claims 14, 16 or 18 further including a gas supply for reestablishing the gaseous atmosphere within the sealable chamber after each opening of the chamber and removal and insertion of a new test item therein, and automatically operable valving means for disconnecting the supply of gaseous atmosphere upon opening of the sealable chamber and automatically valving in a new supply in the correct quantity and pressure of gaseous atmosphere after insertion of the new test item and closure of the sealable chamber.

20. A method using the electrical and photo-emissive properties of a gaseous atmosphere for electrical and physical inspection and testing by optical means of items such as electronic printed circuit boards, ceramic substrates, and other like items which contain or include electrically conductive parts, paths and surfaces for detection of discontinuities, (breaks), undesired conductive areas (shorts), or irregularities in the size or shape of such item and being implement with an apparatus comprising a sealable substantially airtight chamber having a transparent partition disposed over the location of an item under test for allowing viewing of the item being tested; said method comprising introducing an item to be tested into the interior of the chamber and sealing it closed in a substantially airtight manner, introducing a gaseous atmosphere capable of cathode luminescence at a location pressure into the interior of the chamber along with an item under test, coupling one terminal of a source of excitation electric potential with a movable probe to selected test points located within an x-y plane on the surface of an item being tested, and coupling a remaining terminal of said source of excitation electric potential to a conductive surface in said sealable chamber substantially opposite the surface of an item under test whereby cathode luminescence is produced within the sealable chamber around test points excited by the movable probe and around all points having electrical continuity therewith which is observed through the transparent partition.

21. The method according to claim 20 wherein the gaseous atmosphere introduced into the sealable chamber is at a pressure on the order of 10–100 millimeters absolute and comprises one of the inert elements namely helium, neon, argon and mixtures thereof and further includes evacuating the interior of the chamber to a low pressure in the range of 10 to 100 millimeters absolute pressure prior to the introduction of the low pressure gaseous atmosphere into the sealable chamber.

22. The method according to claim 21 further including connecting a large value electrical resistance in the series electrical circuit including the source of excitation electric potential, the movable probe, the gaseous composition and the conductive surface within the sealable chamber to which one terminal of the source of excitation electric potential is connected.

23. The method according to claim 22 further including providing the sealable substantially airtight chamber with a movable, readily sealed opening through which items to be tested may be inserted into and removed easily from the interior of the chamber.

24. The method according to claim 23 wherein the transparent partition comprises a conventional transparent insulating plate which has attached to its underside a plurality of very thin closely spaced conductors with each conductor having an individual current limiting resistance connected in series with it and the source of excitation electric potential is connected to the individual series connected limiting resistances.

25. The method according to claim 23 wherein the transparent partition comprises a transparent insulating cover layer that has a resistivity of the order of 100 ohms per square and a high resistivity inner layer exposed to the gaseous atmosphere within the interior of the sealed chamber that has a resistivity of the order of $10^4$ to $10^8$ ohm-centimeters.

26. The method according to claim 25 wherein the outer transparent insulating layer comprises a glass plate about ¼ of an inch thick, the intermediate low resistance, high conductivity transparent layer comprises tin oxide, or a gold metalization layer, or other similar material having a thickness of approximately 2000 Angstrom units formed on the glass plate and the low conductivity, high resistivity inner layer is comprised of a high resistance, water impregnated polymer coating about 0.2 mills thick.

27. The method according to claim 24 wherein the movable probe has an extremely small mass and is formed by a small conductive tip attached to a fine wire so that it can be moved at a relatively high velocity to different points located within the x-y plane of a printed circuit board, ceramic substrate or other item under test and does not substantially obscure the view of an item under test being observed through the transparent partition.

28. The method according to claim 27 further including providing an electro-optical sensing unit for observing the surface of a printed circuit board, ceramic substrate or other item under test through the transparent partition in the sealable chamber and for producing a display that may be readily viewed by an operator.

29. The method according to claim 26 further including providing an electro-optical sensing unit for observing the surface of a printed circuit board, ceramic substrate or other item under test through the transparent partition in the sealable chamber and for producing a display that may be readily viewed by an operator.

30. The method according to claim 20 further including providing a control computer for controlling operation of the movable probe automatically in accordance with a predesigned test routine.

31. The method according to claim 28 further including a control computer for controlling automatically the positioning of the movable probe in accordance with a predetermined test routine and wherein the electro-optical sensing unit provides an electronic readout indicative of the cathode luminescent image of the test points of an item under test with the electronic readout being supplied back to the control computer for automatic comparison to predetermined standards for a particular test point under observation.

32. The method according to claim 20 further including automatically reestablishing the gaseous atmosphere following each opening and reclosure of the sealed chamber and removal and insertion of a new test item therein.

33. The method according to claim 31 further including automatically replenishing the gaseous atmosphere following each openiang and reclosure of the sealed chamber and removal and insertion of a new test item therein.

* * * * *

UNITED STATES PATENT AND TRADEMARK OFFICE
CERTIFICATE OF CORRECTION

PATENT NO. : 4,507,605

DATED : March 26, 1985

INVENTOR(S) : Donald J. Geisel

It is certified that error appears in the above-identified patent and that said Letters Patent is hereby corrected as shown below:

Column 10, line 34, "ites" should read -- items --.

Column 13, line 5, "implement" should read -- implemented --.

Signed and Sealed this

Twenty-ninth Day of July 1986

[SEAL]

Attest:

DONALD J. QUIGG

Attesting Officer     Commissioner of Patents and Trademarks